United States Patent
Tsukamoto

(10) Patent No.: US 10,056,262 B2
(45) Date of Patent: Aug. 21, 2018

(54) NON-VOLATILE MEMORY HAVING INDIVIDUALLY OPTIMIZED SILICIDE CONTACTS AND PROCESS THEREFOR

(71) Applicant: SanDisk Technologies LLC, Plano, TX (US)

(72) Inventor: Keisuke Tsukamoto, Nagoya (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 15/479,508

(22) Filed: Apr. 5, 2017

(65) Prior Publication Data

US 2017/0207092 A1 Jul. 20, 2017

Related U.S. Application Data

(62) Division of application No. 14/593,694, filed on Jan. 9, 2015.

(51) Int. Cl.
*H01L 21/3205* (2006.01)
*H01L 21/4763* (2006.01)
(Continued)

(52) U.S. Cl.
CPC .. *H01L 21/28052* (2013.01); *H01L 21/28273* (2013.01); *H01L 27/11521* (2013.01);
(Continued)

(58) Field of Classification Search
CPC ......... H01L 27/11521; H01L 27/11524; H01L 27/11526; H01L 27/11529; H01L 27/115;
(Continued)

(56) References Cited

U.S. PATENT DOCUMENTS 5,768,192 A 6/1998 Eitan
6,011,725 A 4/2000 Eitan
(Continued)

OTHER PUBLICATIONS

Eitan et al., "NROM: A Novel Localized Trapping, 2-Bit Nonvolatile Memory Cell," IEEE Electron Device Letters, vol. 21, No. 11, Nov. 2000, pp. 543-545.
(Continued)

*Primary Examiner* — David Chen
(74) *Attorney, Agent, or Firm* — Vierra Magen Marcus LLP

(57) ABSTRACT

In an integrated-circuit memory, performance is increased by reducing an electrical contact resistance between a metal layer and an upper poly layer (a control gate poly). The electrical contact resistance is reduced by increasing the thickness of a silicide layer between the metal layer and the upper poly layer. The memory has a memory cell region and a non-memory cell region. The thickness of the silicide layer is typically restricted by consideration of integrated-circuit fabrication geometry for each memory cell not to exceed a predetermined aspect ratio. The present implementation allows independent optimization of the thickness of silicide layer in the memory cells region and the non-memory cell region. In particular, in the non-memory cell region, a thicker silicide layer significantly improves the contact resistance of a slit contact for components having the upper poly layer in contact with a lower poly layer (a floating gate poly).

11 Claims, 15 Drawing Sheets

(51) Int. Cl.
  *H01L 21/28*      (2006.01)
  *H01L 27/11524*   (2017.01)
  *H01L 27/11529*   (2017.01)
  *H01L 27/11531*   (2017.01)
  *H01L 27/11526*   (2017.01)
  *H01L 27/11521*   (2017.01)

(52) U.S. Cl.
  CPC .. *H01L 27/11524* (2013.01); *H01L 27/11526* (2013.01); *H01L 27/11529* (2013.01); *H01L 27/11531* (2013.01)

(58) Field of Classification Search
  CPC ......... H01L 21/28052; H01L 27/11531; H01L 21/28273
  USPC ... 257/314, 316, E21.422, E21.681, E21.69, 257/E27.103, E29.3; 438/257, 258, 587, 438/593
  See application file for complete search history.

(56) References Cited

U.S. PATENT DOCUMENTS

| | | | |
|---|---|---|---|
| 8,338,365 B2 | 12/2012 | Minea et al. | |
| 2001/0030342 A1 | 10/2001 | Ohnishi | |
| 2009/0140315 A1* | 6/2009 | Kuniya | H01L 27/115 257/316 |
| 2009/0317966 A1* | 12/2009 | Matsuo | H01L 21/28052 438/586 |
| 2010/0065900 A1* | 3/2010 | Murata | H01L 27/0629 257/314 |
| 2010/0072534 A1* | 3/2010 | Nagano | H01L 27/11519 257/316 |
| 2010/0155813 A1* | 6/2010 | Murata | H01L 27/11521 257/316 |
| 2010/0172180 A1 | 7/2010 | Paley et al. | |
| 2011/0260235 A1 | 10/2011 | Orimoto | |
| 2012/0032246 A1* | 2/2012 | Honda | H01L 21/28273 257/316 |
| 2012/0032247 A1* | 2/2012 | Nagashima | H01L 21/28273 257/316 |
| 2012/0086057 A1* | 4/2012 | Kim | H01L 27/11521 257/288 |
| 2014/0015030 A1* | 1/2014 | Han | H01L 29/788 257/316 |
| 2014/0264531 A1* | 9/2014 | Goyo | H01L 29/66825 257/316 |
| 2014/0339613 A1* | 11/2014 | Ide | H01L 27/11524 257/288 |

OTHER PUBLICATIONS

Requirement for Restriction, dated Nov. 3, 2015, in U.S. Appl. No. 14/593,694.
Response to Election/Restriction filed Jun. 29, 2016, in U.S. Appl. No. 14/593,694.
Office Action, dated Jan. 6, 2017, in U.S. Appl. No. 14/593,694.

* cited by examiner

NON-VOLATILE MEMORY HAVING INDIVIDUALLY OPTIMIZED SILICIDE CONTACTS AND PROCESS THEREFOR

CLAIM OF PRIORITY

This application is a divisional of and claims priority to U.S. patent application Ser. No. 14/593,694 filed Jan. 9, 2015, and published as US 2017/0054032 on Feb. 23, 2017, entitled "NON-VOLATILE MEMORY HAVING INDIVIDUALLY OPTIMIZED SILICIDE CONTACTS AND PROCESS THEREFOR", the entirety of which is incorporated herein by reference.

BACKGROUND

This application relates generally to two- or three-dimensional nonvolatile memory integrated circuits such as semiconductor flash memory and its fabrication, and more specifically, to ones having different low resistance metal silicide contacts optimized for different portions of the integrated circuits.

Solid-state memory capable of nonvolatile storage of charge, particularly in the form of EEPROM and flash EEPROM packaged as a small form factor card, has become the storage of choice in a variety of mobile and handheld devices, notably information appliances and consumer electronics products. Unlike RAM (random access memory) that is also solid-state memory, flash memory is non-volatile, and retains its stored data even after power is turned off. Also, unlike ROM (read only memory), flash memory is rewritable similar to a disk storage device. In spite of the higher cost, flash memory is increasingly being used in mass storage applications.

Flash EEPROM is similar to EEPROM (electrically erasable and programmable read-only memory) in that it is a non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions. Flash memory such as Flash EEPROM allows entire blocks of memory cells to be erased at the same time.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

Nonvolatile memory devices are also manufactured from memory cells with a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric.

There are many commercially successful semiconductor memory devices being used today. These semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magneto-resistive random access memory ("MRAM"), and other semiconductor elements capable of storing information. Furthermore, each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles or a charge storage dielectric material.

Multiple memory elements may be configured so that they are connected in series or such that each element is individually accessible. By way of non-limiting example, NAND devices contain memory elements (e.g., devices containing a charge storage region) connected in series. For example, a NAND memory array may be configured so that the array is composed of multiple strings of memory in which each string is composed of multiple memory elements sharing a single bit line and accessed as a group. In contrast, memory elements may be configured so that each element is individually accessible, e.g., a NOR memory array. One of skill in the art will recognize that the NAND and NOR memory configurations are exemplary, and memory elements may be otherwise configured.

The semiconductor memory elements of a single device, such as elements located within and/or over the same substrate or in a single die, may be distributed in two or three dimensions, such as a two dimensional array structure or a three dimensional array structure.

In a two dimensional memory structure, the semiconductor memory elements are arranged in a single plane or single memory device level. Typically, in a two dimensional memory structure, memory elements are located in a plane (e.g., in an x-z direction plane) which extends substantially parallel to a major surface of a substrate that supports the memory elements. The substrate may be a wafer over which the layers of the memory elements are deposited and/or in which memory elements are formed or it may be a carrier substrate which is attached to the memory elements after they are formed.

The memory elements may be arranged in the single memory device level in an ordered array, such as in a plurality of rows and/or columns. However, the memory elements may be arranged in non-regular or non-orthogonal configurations as understood by one of skill in the art. The memory elements may each have two or more electrodes or contact lines, such as bit lines and word lines.

A three dimensional memory array is organized so that memory elements occupy multiple planes or multiple device levels, forming a structure in three dimensions (i.e., in the x, y and z directions, where the y direction is substantially perpendicular and the x and z directions are substantially parallel to the major surface of the substrate).

As a non-limiting example, each plane in a three dimensional memory array structure may be physically located in two dimensions (one memory level) with multiple two dimensional memory levels to form a three dimensional memory array structure. As another non-limiting example, a three dimensional memory array may be physically structured as multiple vertical columns (e.g., columns extending substantially perpendicular to the major surface of the substrate in the y direction) having multiple elements in each column and therefore having elements spanning several vertically stacked memory planes. The columns may be arranged in a two dimensional configuration, e.g., in an x-z plane, thereby resulting in a three dimensional arrangement of memory elements. One of skill in the art will understand that other configurations of memory elements in three dimensions will also constitute a three dimensional memory array.

By way of non-limiting example, in a three dimensional NAND memory array, the memory elements may be connected together to form a NAND string within a single horizontal (e.g., x-z) plane. Alternatively, the memory elements may be connected together to extend through multiple horizontal planes. Other three dimensional configurations can be envisioned wherein some NAND strings contain memory elements in a single memory level while other strings contain memory elements which extend through multiple memory levels. Three dimensional memory arrays may also be designed in a NOR configuration and in a ReRAM configuration.

A monolithic three dimensional memory array is one in which multiple memory levels are formed above and/or within a single substrate, such as a semiconductor wafer. In a monolithic three-dimensional array the layers of each level of the array are formed on the layers of each underlying level of the array. One of skill in the art will understand that layers of adjacent levels of a monolithic three dimensional memory array may be shared or have intervening layers between memory levels. In contrast, two dimensional arrays may be formed separately and then packaged together to form a non-monolithic memory device. For example, non-monolithic stacked memories have been constructed by forming memory levels on separate substrates and adhering the memory levels atop each other. The substrates may be thinned or removed from the memory levels before bonding, but as the memory levels are initially formed over separate substrates, such memories are not monolithic three dimensional memory arrays. Further, multiple two dimensional memory arrays or three dimensional memory arrays (monolithic or non-monolithic) may be formed separately and then packaged together to form a stacked-chip memory device.

Semiconductor devices typically have one or more polysilicon layer as gate electrode material for devices. A polysilicon gate's electrical conductivity may be increased by depositing a metal (such as tungsten) or a metal silicide (such as tungsten silicide) over the gate. Polysilicon may also be employed as a conductor or as an ohmic contact for shallow junctions, with the desired electrical conductivity attained by doping the polysilicon material.

For example, in a NAND memory device, memory cells and other circuit elements are formed on the same wafer. Typically, depositions of polysilicon/metal silicide/metal contact are performed across the wafer. A configuration of polysilicon/metal silicide/metal contact may be optimized for the memory cells but not for the other circuit elements. This may result in higher than optimal resistances in the metal contacts of the other circuit elements.

Thus, there is a need to provide a memory device and processing method where the configuration of silicide is independently optimized for the memory cells and for the other circuit elements to provide lower contact resistance for the other circuit elements.

SUMMARY

In an integrated-circuit memory, performance is increased by reducing an electrical contact resistance between a metal layer and an upper or first poly layer (a control gate poly). The electrical contact resistance is reduced by increasing the thickness of a silicide layer between the metal layer and the upper poly layer. The memory has a memory cell region and a non-memory cell region. The thickness of the silicide layer is typically restricted by consideration of integrated-circuit fabrication geometry for each memory cell not to exceed a predetermined aspect ratio. The present implementation allows independent optimization of the thickness of silicide layer in the memory cells region and the non-memory cell region. In particular, in the non-memory cell region, a thicker silicide layer significantly improves the contact resistance of a slit contact for components having the upper poly layer in contact with a lower poly layer (a floating gate poly).

The thicker silicide layer in the non-memory cell region is accomplished by a self-aligned silicide process. The process includes using a mask layer to open a trench in the non-memory cell region that extends from the upper first poly layer to the lower poly layer, depositing a second poly layer, etching back the second poly layer to the mask layer, depositing a first metal layer and annealing to form a first silicide layer between the first metal layer and the second poly layer, removing the first metal layer and the mask layer to expose the first poly layer, and depositing a second metal layer and annealing to form a second silicide layer between the second metal layer and the first poly layer. In this way, regions masked by the mask layer have the second silicide layer and regions unmasked by the mask layer has a combined first and second silicide layer.

The non-memory cell region includes a component with a slit contact. The step of etching back the second poly layer to the mask layer to expose the first poly layer also expose a portion the lower poly layer. The step of depositing a second metal layer and annealing to form a second silicide layer between the second metal layer and the first poly layer and also between the second metal layer and the lower poly layer.

Various aspects, advantages, features and embodiments are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

DETAILED DESCRIPTION

Memory System

Figure 1:
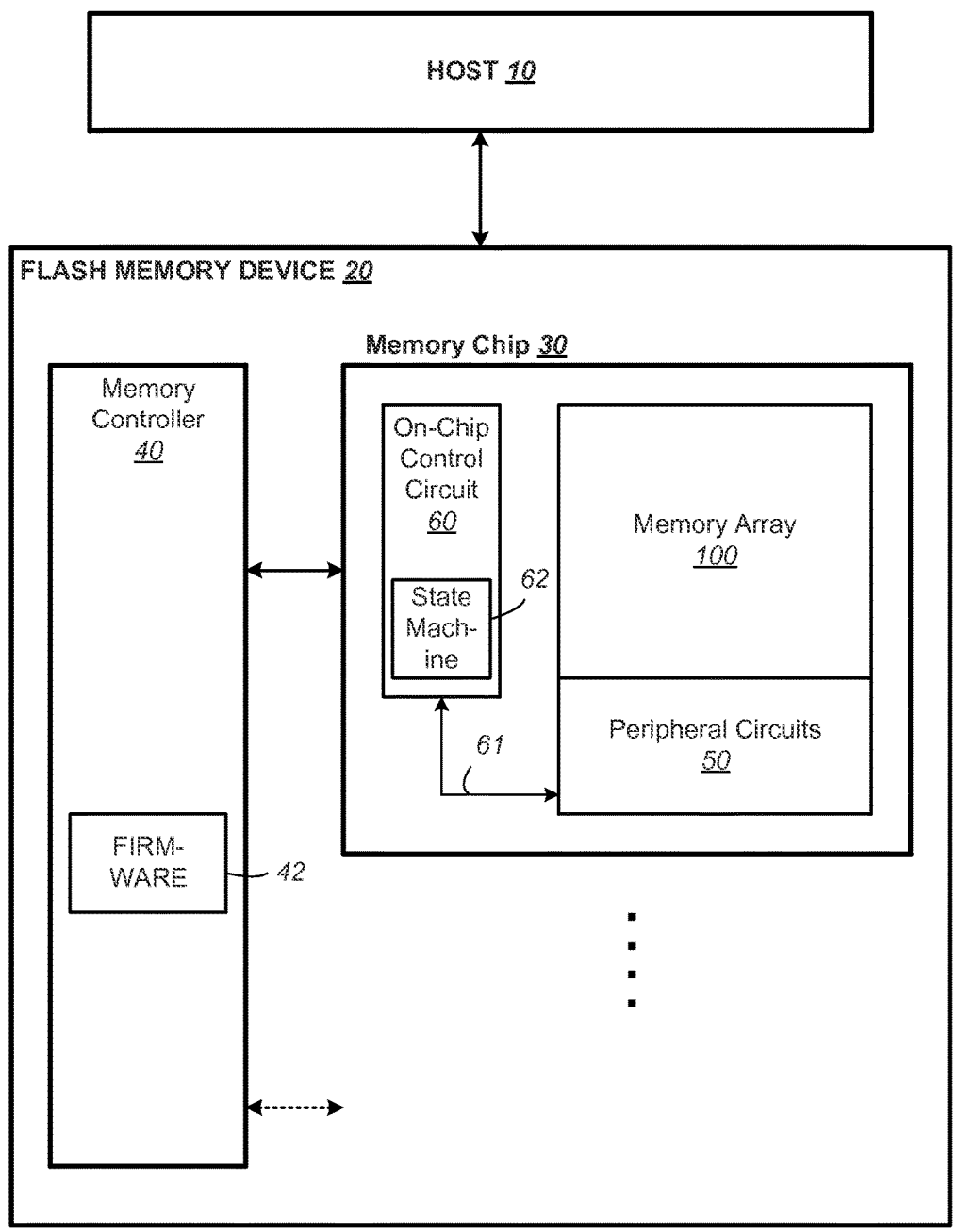
FIG. 1 illustrates a host in communication with a memory device in which the features of the present invention are embodied.

FIG. 1 illustrates a host in communication with a memory device in which the features of the present invention are embodied. The host 10 typically sends data to be stored at the memory device 20 or retrieves data by reading the memory device 20. The memory device 20 includes one or more memory chip 30 managed by a memory controller 40. The memory chip 30 includes a memory array 100 of memory cells with each cell capable of being configured as a multi-level cell ("MLC") for storing multiple bits of data, as well as capable of being configured as a single-level cell ("SLC") for storing 1 bit of data. The memory chip also includes peripheral circuits 50 such as row and column decoders, sense modules, data latches and I/O circuits. An on-chip control circuitry 60 controls low-level memory operations of each chip. The control circuitry 60 is an on-chip controller that cooperates with the peripheral circuits 50 to perform memory operations on the memory array 100. The control circuitry 60 typically includes a state machine 62 to provide chip level control of memory operations via data, control and address buses 61.

In many implementations, the host 10 communicates and interacts with the memory chip 30 via the memory controller 40. The controller 40 co-operates with the memory chip and controls and manages higher level memory operations. A firmware 42 provides codes to implement the functions of the controller 40. An error correction code ("ECC") processor (not shown) in the controller processes ECC during operations of the memory device 20.

For example, in a host write, the host 10 sends data to be written to the memory array 100 in logical sectors allocated from a file system of the host's operating system. A memory block management system implemented in the controller stages the sectors and maps and stores them to the physical structure of the memory array. A preferred block management system is disclosed in United States Patent Application Publication Number: US-2010-0172180-A1, the entire disclosure of which is incorporated herein by reference.

Physical Memory Architecture

In order to improve read and program performance, multiple memory cells or memory transistors in the memory array are read or programmed in parallel. Thus, a "page" of memory cells are read or programmed together. In existing memory architectures, a row typically contains several interleaved pages or it may constitute one page. All memory cells of a page will be read or programmed together.

Similar, to improve erase performance, a block of memory cells organized in pages is erased as a unit. The block is sometimes referred to as a "flash" block and a memory with block erase structure is referred to as a "flash" memory.

Figure 2:
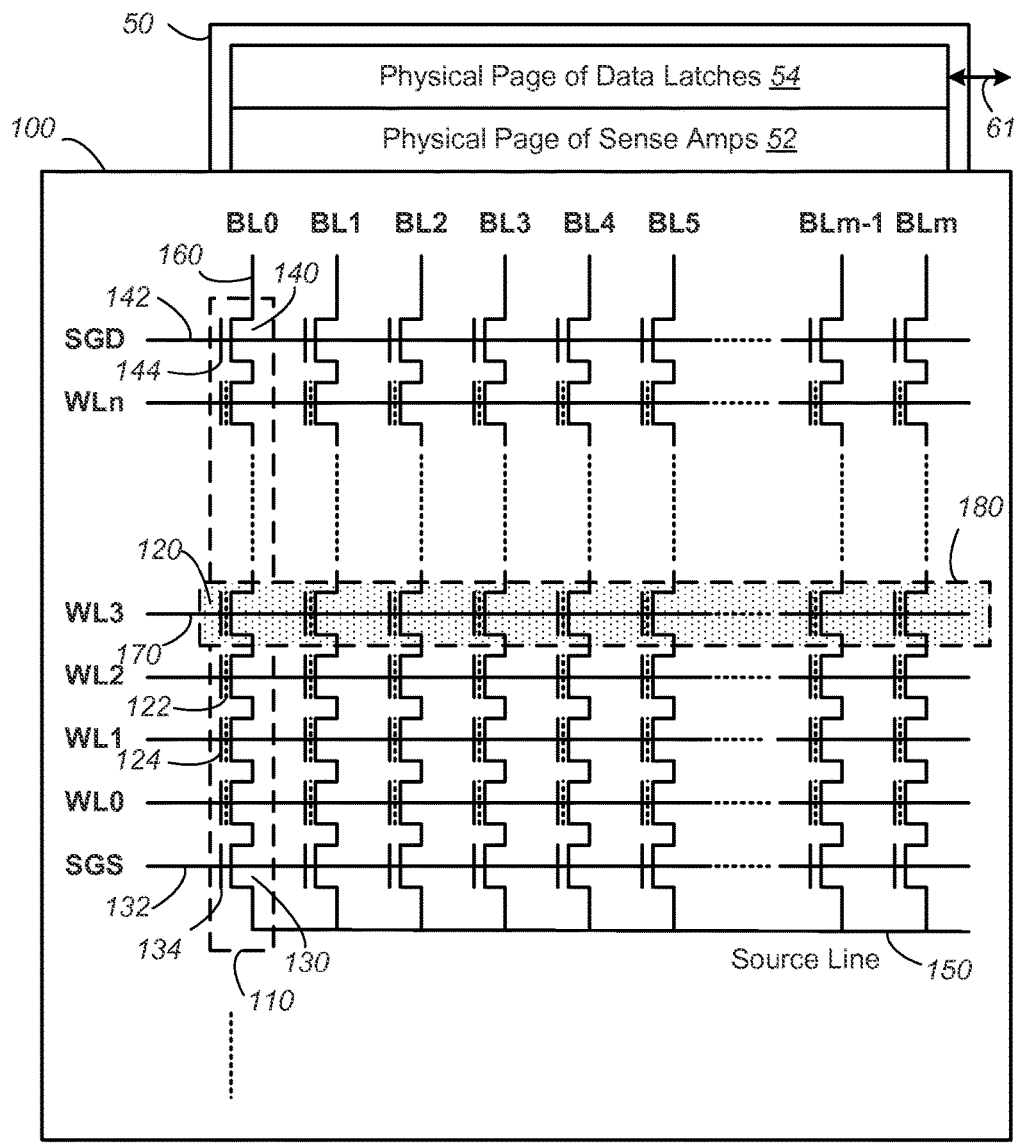
FIG. 2 illustrates an example memory organization in the NAND configuration in which a page of memory cells is sensed or programmed in parallel.

FIG. 2 illustrates an example memory organization in the NAND configuration in which a page of memory cells is sensed or programmed in parallel. FIG. 2 essentially shows a row of NAND strings 110 in the memory array 100 of FIG. 1.

Each NAND string 110 is a series of memory transistors 120 daisy-chained by their sources and drains to form a source terminal and a drain terminal respective at its two ends. A pair of select transistors 130, 140 controls the memory transistors chain's connection to the external via the NAND string's source terminal and drain terminal respectively. In the memory array, when the source select transistor 130 is turned on via a source select line SGS 132, the source terminal is coupled to a source line 150. Similarly, when the drain select transistor 140 is turned on via the drain select line SGD 142, the drain terminal of the NAND string 110 is coupled to a bit line 160 of the memory array. Each memory transistor 120 in the NAND string 110 acts as a memory cell 120. The memory cell 120 has a charge storage element 122, such as a floating gate, to store a given amount of charge so as to represent an intended memory state. A control gate 124 of each memory transistor allows control over read and write operations. The control gates 124 of corresponding memory transistors 120 among the row of NAND strings are all connected to the same word line 170 (such as one of WL0, WL1, . . . ). Similarly, control gates 134, 144 corresponding to the select transistors 130, 140 (accessed via select lines SGS 132 and SGD 142 respectively) provide control access to the NAND string 110 via its source terminal and drain terminal respectively.

A "page" such as the page 180, is a group of memory cells 120 enabled to be sensed or programmed in parallel via a row of bit lines 160. This is accomplished in the peripheral circuits 50 by a corresponding page of sense amplifiers 52. The sensed results are latches in a corresponding set of data latches 54. Each sense amplifier can be coupled to a NAND string, such as NAND string 110 via a bit line, such as bit line 160. For example, the page 180 is along a row and is sensed by a sensing voltage applied to the control gates 124 of the memory cells 120 of the page connected in common to the word line WL3. Along each column, each memory cell such as memory cell 120 is accessible by a sense amplifier via a bit line. Data in the data latches 54 are toggled in from or out to the memory controller 40 via the buses 61. The page 180 referred to above is a physical page memory cells or sense amplifiers. Depending on context, in the case where each cell is storing multi-bit data, each physical page has multiple data pages.

Figure 3:
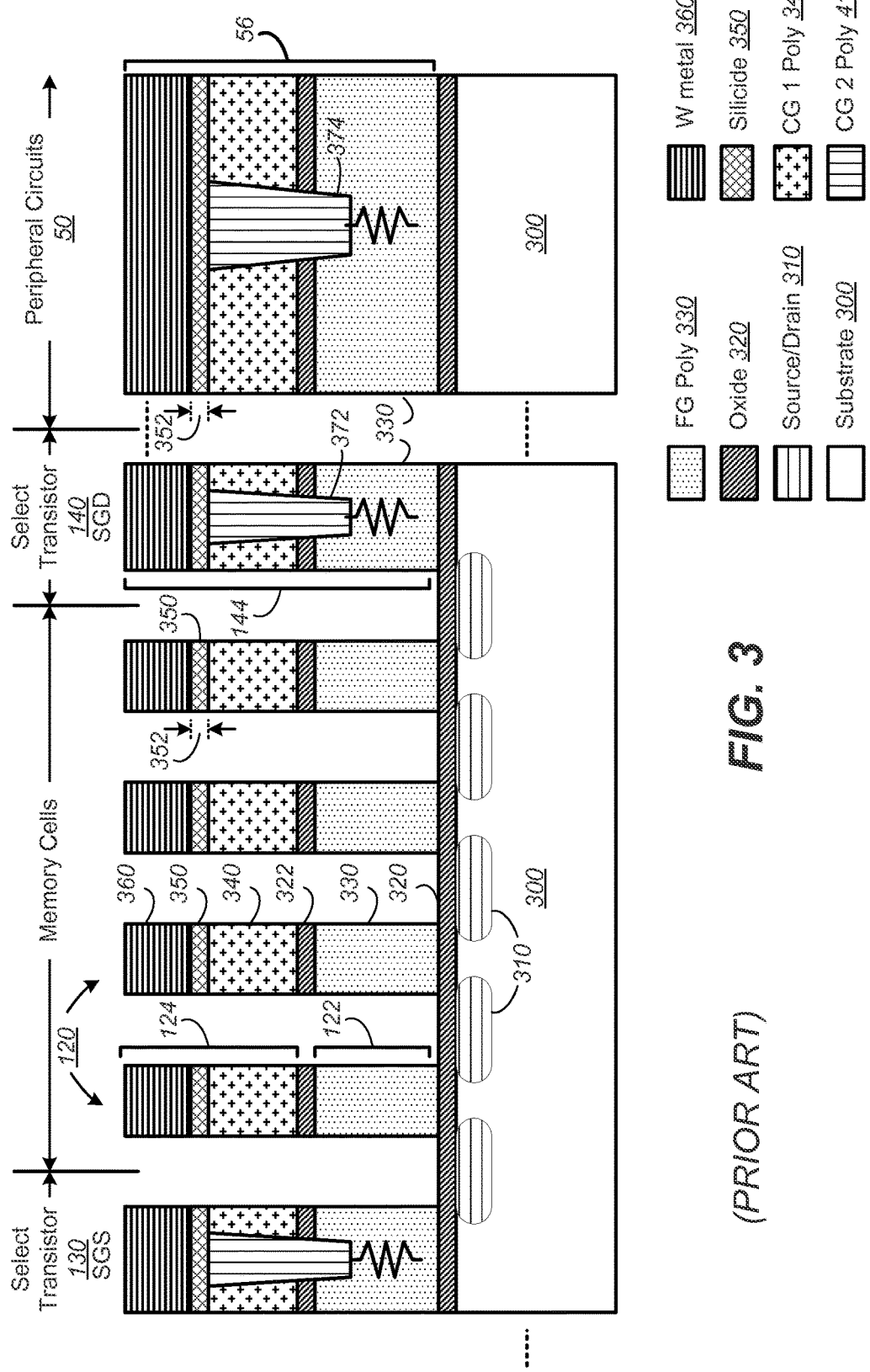
FIG. 3 illustrates schematically a conventional semiconductor structure for realizing the example NAND memory of FIG. 2.

FIG. 3 illustrates schematically a conventional semiconductor structure for realizing the example NAND memory of FIG. 2. Semiconducting devices comprising different types of components are typically formed on a silicon substrate 300. In this case, there are memory cell components such as memory cells 120 and other type of non-memory cell components, such as select transistors 130, 140 and a device element 56 in peripheral circuits 50.

FIG. 3 illustrates a NAND string with four memory cells 120. The individual memory cells 120 of the NAND are isolated with oxide in between (not shown). Referring also to FIG. 2, for the memory cell 120, essentially the FG poly layer 330 forms the floating gate 122. The CG 1 poly layer 340, the silicide layer 350 and the metal layer 360 form the control gate 124.

For the memory cell components, each memory cell 120 is basically a field-effect transistor whose field is further modified by charges programmed into the floating gate 122. Channel regions are formed in the substrate 300 by doping source and drain regions 310. A layer of oxide 320 provides insulation from the channel region. This is followed by a layer of FG poly 330 to implement a floating gate 122. A gate oxide layer 322 insulates the floating gate 330 from above. Then a layer of CG 1 poly 340 acting as a control gate electrode is placed on top of the gate oxide 322. A composite control gate 124 with improved conductivity is achieved by a layer of metal 360, such as tungsten on top of the CG 1 poly 340. Furthermore, the resistance of the metal contact 360 to the control gate electrode 340 is significantly reduced with an interfacing metal silicide layer 350.

For the non-memory cell components, such as the select transistors 130 and 140, they are basically field-effect transistors They respectively control the connection of the source and drain terminals of the NAND string to the external. As they are not memory cells, there is no need for the FG poly layer 330 that forms the floating gate 122. Thus, for the non-memory cell components, the existing FG poly layer 330 is electrically incorporated into the select gate, such as select b gate 134, 144 or 56. This is accomplished by connecting the composite control gate 124 directly to the FG poly layer 330 by a conductive poly plug 372. The poly plug is effected by a CG 2 poly 410 filling that effectively incorporates the FG poly layer 330 (i.e., the floating b gate poly) as part of a device control gate or select gate 144 or 56.

Similarly for other non-memory cell components, such the peripheral circuits 50, they include field-effect transistors. Thus, a poly plug 374 constituting from the CG 2 poly 410 filling is employed to form an electrical connection between the existing FG poly layer 330 (i.e., the floating gate poly) and the control gate to form a gross control or select gate 56.

Generally, the lower the metal contact resistance to the control gate electrode, the better is the speed performance of the memory device. Earlier, it has been described that an interfacing metal silicide layer 350 between the metal layer 360 and the CG 1 poly 340 significantly reduces the contact resistance. Typically, the thicker the metal silicide layer 350, the lower is the contact resistance. The metal silicide layer 350 is formed after deposition of the CG 1 poly layer 340 and the metal layer 360 by annealing under elevated temperature to form the silicide layer 350 at their common interface.

While it is desirable to have a thicker silicide layer 350, however, the memory cell geometry places a limitation on the thickness. As can be seen from FIG. 3, each layer constituting a memory cell 120 requires a certain thickness for optimum functioning and performance. For example, the metal layer 360 needs to be of sufficient thickness to be robust and of low resistance. When all the layers are tallied, the memory cell already has a column structure with an aspect ratio beyond which "word line collapse" is liable to occur. Thus, the thickness 352 of the metal silicide layer 350 as well as that of the metal layer 360 each has an upper limit predetermined by consideration of the geometry of the memory cell (memory cell components) during fabrication, which by extension also imposes the same limit on the non-memory cell components as the deposition of each of the CG 1 poly layer 340 and the metal layer 360 is performed across the substrate at the same time.

For the peripheral circuits among the non-memory cell components, without the option of further increasing the thickness of the metal silicide layer 350, one way of reducing the resistance of the metal contact resistance to the control gate electrode is to form a "slit contact". U.S. Pat. No. 8,338,365 B2 discloses a similar slit contact in which the metal layer 360 and the silicide layer 350 drop into a trench or "slit" to make contact with structures closer to or underneath the substrate.

Figure 4:
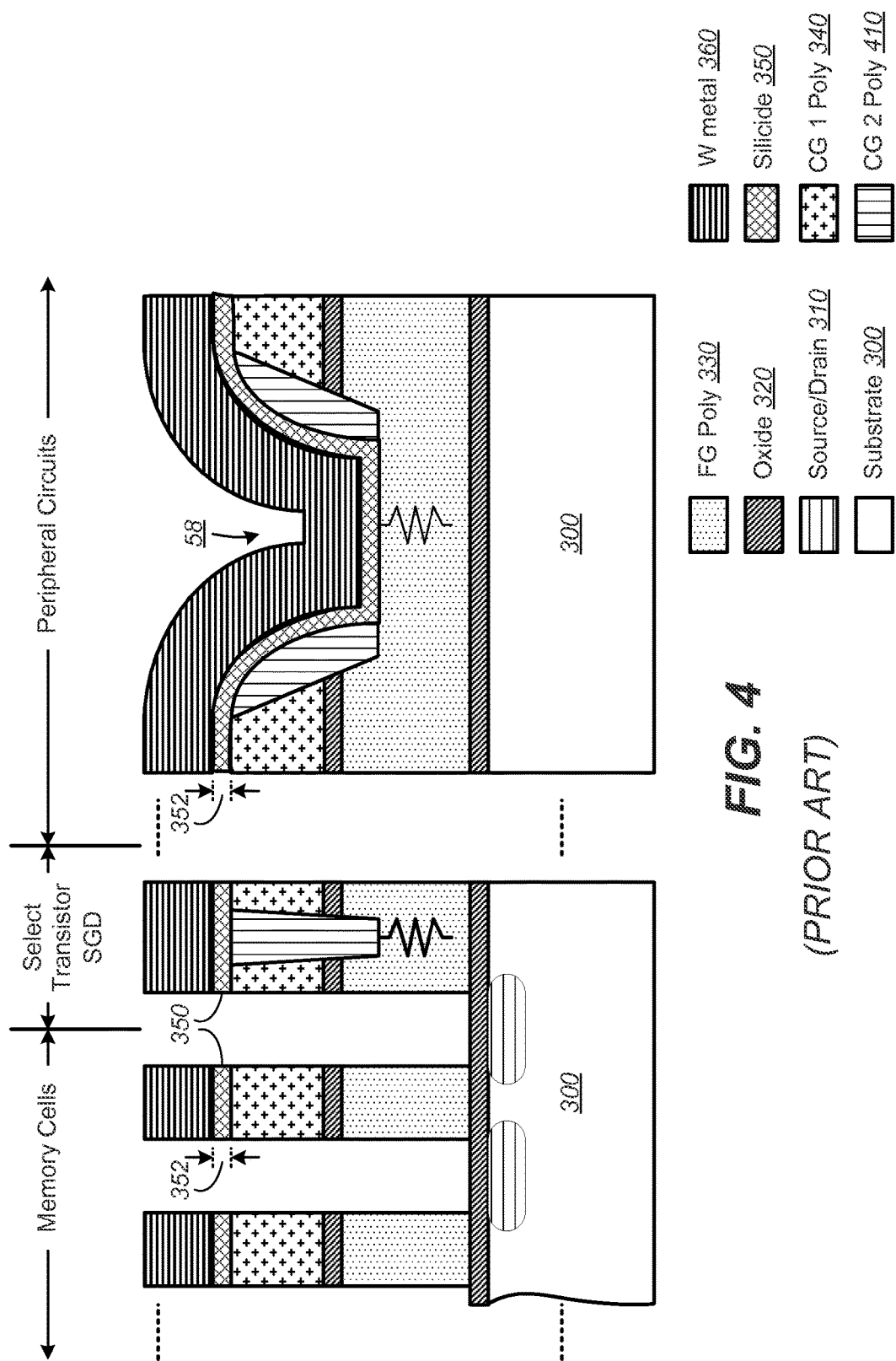
FIG. 4 illustrates schematically an example of a conventional slit contact for the peripheral circuits.

FIG. 4 illustrates schematically an example of a conventional slit contact for the peripheral circuits. A trench or slit is open to access the FG Poly layer 330. The metal layer 360 and the silicide layer 350 are dropped into and around the trench to form a slit contact 58. In this way, contact resistance is reduced owing to the increased contact area. The slit contact 58 improves over the poly plug 374 shown in FIG. 3.

Figure 5:
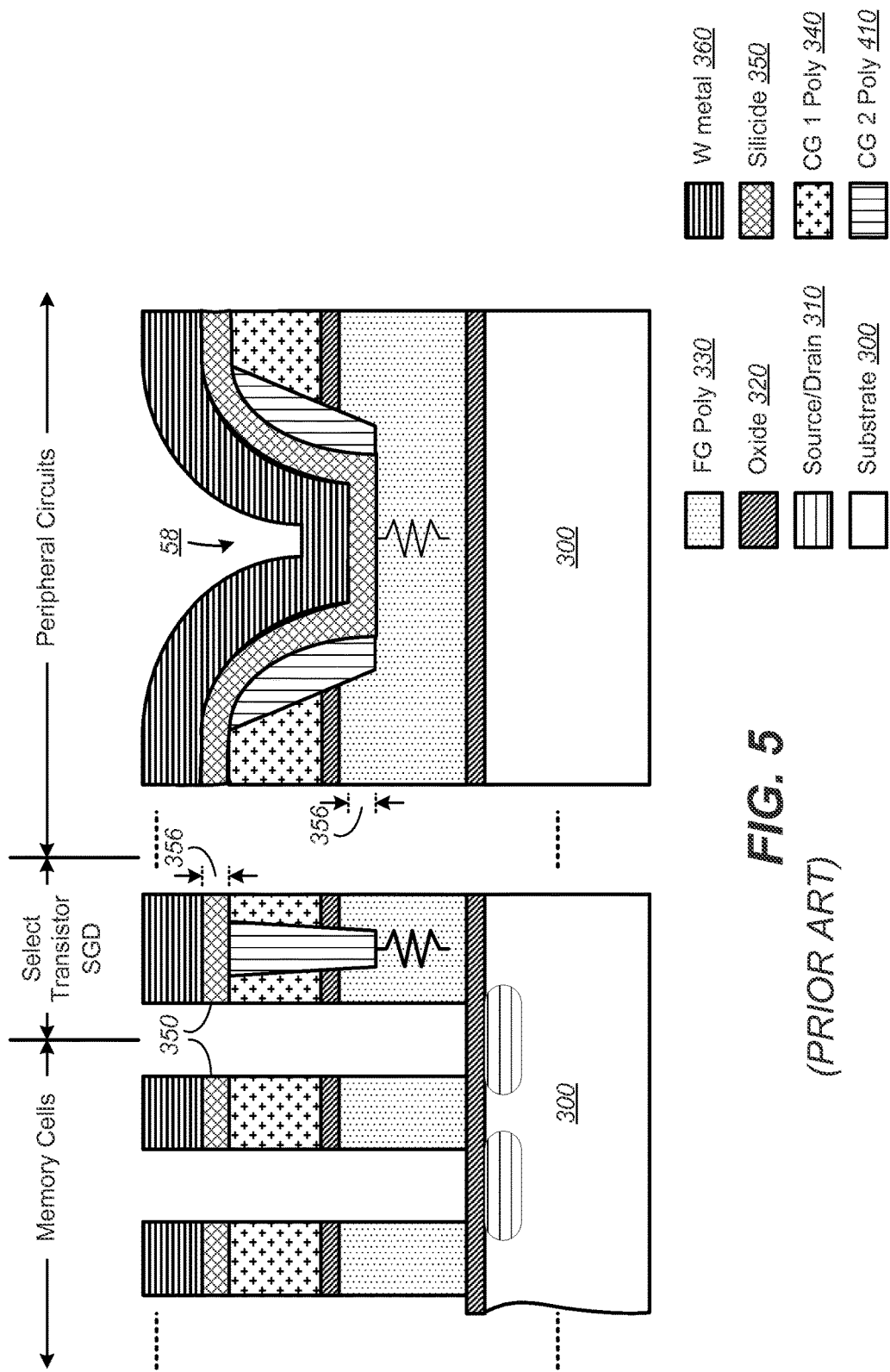
FIG. 5 illustrates schematically a further modification to the slit contact shown in FIG. 4.

FIG. 5 illustrates schematically a further modification to the slit contact shown in FIG. 4. As described with regard to FIG. 4, the slit contact 58 improves over the poly plug 374. Still, the contact resistance could be further improved if the silicide layer 350 has a thickness 356 that is greater than the previous thickness 352 shown in FIG. 3 and FIG. 4. However, as explained earlier, this is infeasible because the previous thickness 352 is already optimized and limited by considerations in fabricating the memory cells portion of the chip. The select transistors are dependent on low contact resistance to switch an entire NAND string. Similar, the performance of the peripheral circuits could improve with lower contact resistance. A lower resistance in the circuits generally improves on the operating speed of the memory.

According, it is desirable to have a memory device with a semiconductor structure in which the different types of device element are independently optimized.

Silicide in the Memory Cells not Impacted by Thicker Silicide in Other Devices on the Same Chip A memory device has a semiconductor structure comprising multiple layers on a substrate. The multiple layers including a floating gate layer, a control gate layer, a metal silicide layer and a metal layer. The semiconductor structure comprises memory cell components and non-memory cell components.

The memory cell components include non-volatile memory cells. Each memory cell has a floating gate layer, a control gate layer, a metal layer and a metal silicide layer interfacing between the control gate layer and the metal layer.

The non-memory cell components include select transistors with individual ones sharing similar layer structure as the first type of device element but also with its floating gate electrically connected to its control gate by a connecting plug.

The non-memory cell components also include peripheral circuits, with individual ones sharing similar layer structure as the first type of device element but also with a slit contact that has the metal layer dips into the floating gate layer. The non-memory cell components are characterized by a metal silicide layer having additional thickness compared to that of the memory cell components. In this way, the metal silicide layers for the two types of components are independently optimized. In the case of the select transistors, the additional thickness in metal silicide layer improves the conductance between the metal layer and the control gate and connected floating gate layers. In the case of the peripheral devices, the conductance between the metal layer and the floating gate layer is improved.

Figure 6:
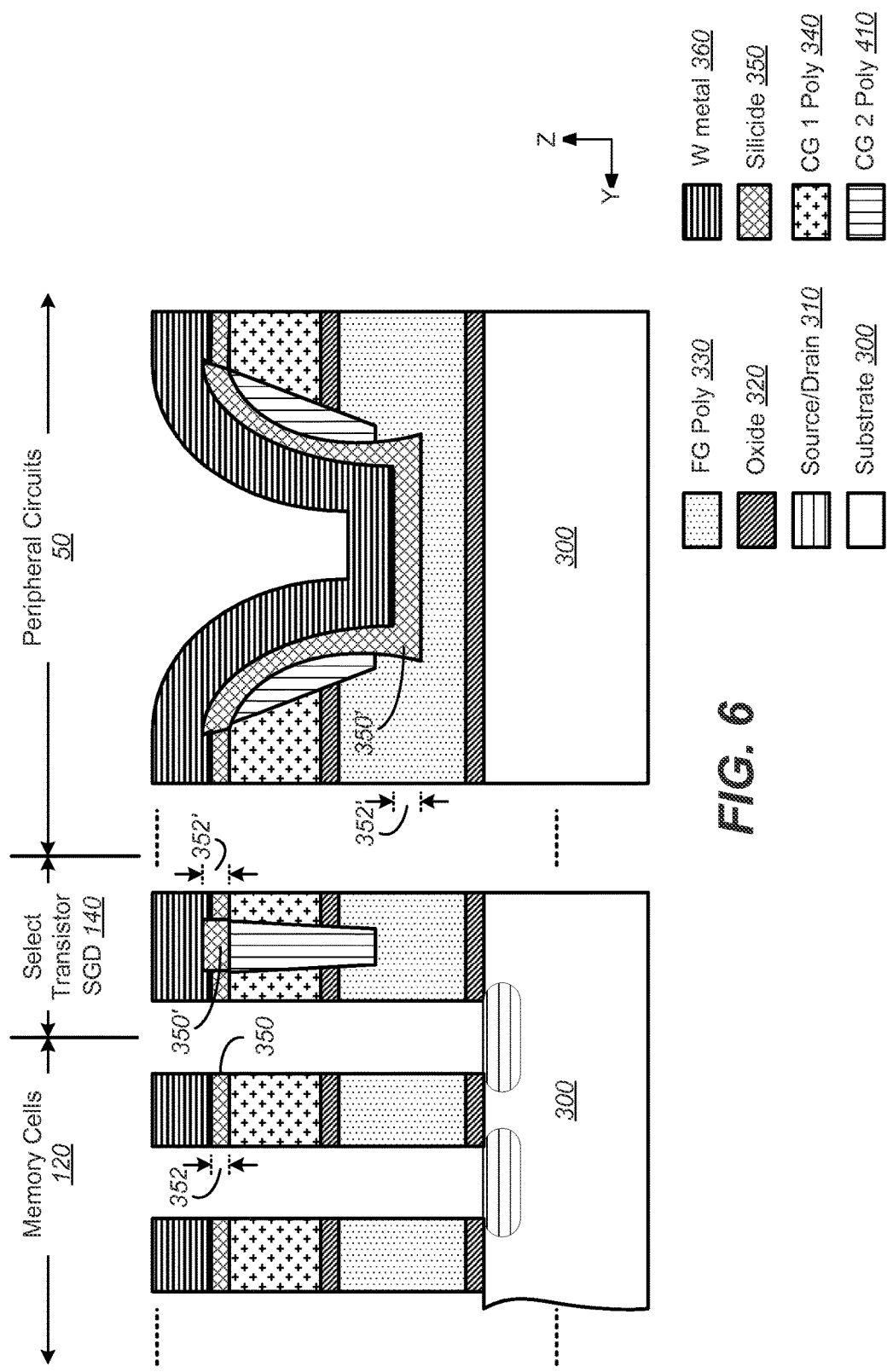
FIG. 6 illustrates a memory device with the metal silicide layer being of different thickness for the different types of device element.

FIG. 6 illustrates a memory device with the metal silicide layer being of different thickness b for the different types of device element. The memory chip 30 of FIG. 1 has a semiconductor structure comprising multiple layers on a substrate 300. The multiple layers including a floating gate layer, such as a doped polysilicon layer, FG Poly 330, a control gate layer, such as a doped polysilicon layer, CG1 Poly 340, a metal silicide layer 350 and a metal layer 360, such as titanium.

The semiconductor structure comprises memory cell components and non-memory cell components.

The memory cell components include a non-volatile memory cell 120, having the floating gate layer FG Poly 330, the control gate layer CG1 Poly 340, the metal layer 360 and the metal silicide layer 350 interfacing between the control gate layer 340 and the metal layer 360.

The non-memory cell components include a select transistor 140, sharing similar layer structure as the memory cell components but with its floating gate 330 electrically connected to its control gate 340 by a connector plug.

The non-memory cell components also include the peripheral circuits 50. The device element of the peripheral circuits shares similar layer structure as the memory cell components but with a slit contact that has the metal layer 360 dips into the floating gate layer 330.

The non-memory cell components are characterized by having a metal silicide layer 350 of additional thickness compared to that of the memory cell components. In the case of the select transistors, the metal silicide layer 350' has a thickness 352', which is thicker than that of the metal silicide layer 350 for the first type of device. In the case of the device element of the peripheral devices, the metal silicide layer 350' has a thickness 352', which is thicker than that of the metal silicide layer 350 for the memory cell components. The additional thickness in metal silicide layer 350' of the non-memory cell components improve the conductance between the metal layer to the connector plug for the select transistor 140 or to the floating gate for the device element of the peripheral circuits 50. As can be seen from FIG. 6, the metal silicide layers 350 and 350' for the two types of components coexisting on the same substrate 300 are independently optimized.

Process

FIG. 7 to FIG. 15 illustrate a self-aligned silicide process of forming independently optimized metal silicide layer in the structure illustrated in FIG. 6.

For example, a NAND memory device is fabricated on top of a semiconductor substrate to form a memory device chip. The fabrication comprises of two parts. In the first part is the formation of a gross structure of the memory device, which includes the memory cell components (e.g., NAND memory cells), and the non-memory cell components. The gross structure and therefore the silicide thickness are primarily dictated by the requirements of forming the memory cell components (e.g., NAND memory cells). In the second part, additional process steps allow thicker silicide layers to be formed in the non-memory cell components compared to that in the first-type devices.

Figure 7:
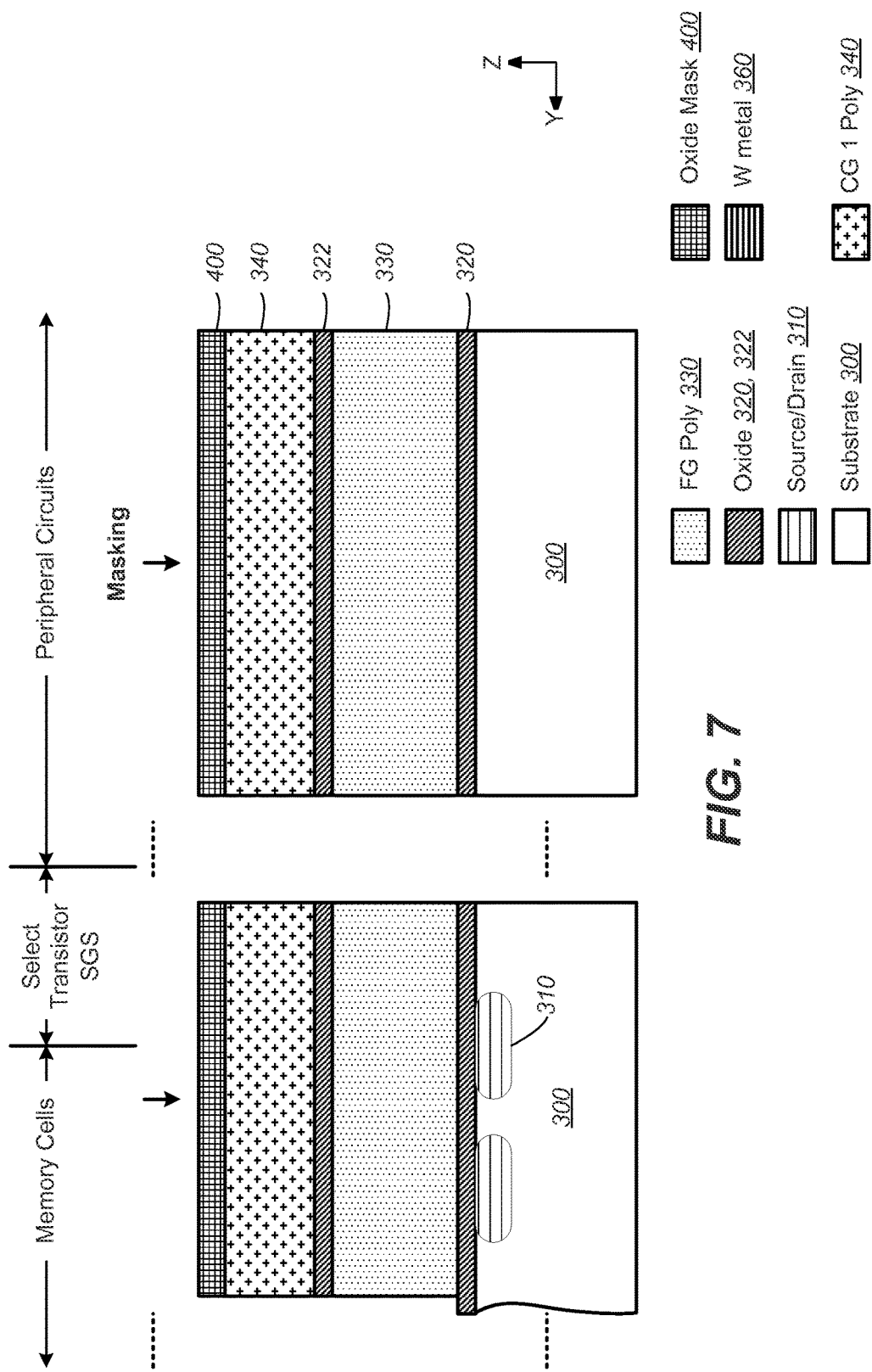
FIG. 7 is a cross-sectional view of a slab, which constitutes the gross structure after the first part of the fabrication.

FIG. 7 is a cross-sectional view of a slab, which constitutes the gross structure after the first part of the fabrication. Essentially, a slab has been formed comprising of multiple layers that correspond to the gross structure of the NAND memory. First, diffusion regions 310 are formed in the substrate 300 for the sources and drains of the memory cells. Then the following layers are deposited in turn on top of each other. A first layer of insulating oxide 320 is formed on top of the substrate 300. A layer of FG (floating gate) poly 330 is formed on top of the oxide 320. A second layer of oxide 322 is formed on top of the FG poly 330. A layer of CG 1 Poly 340 is formed on top of the second layer of oxide 322. A layer of oxide mask 400 is formed on top of the layer of CG 1 Poly.

Figure 8:
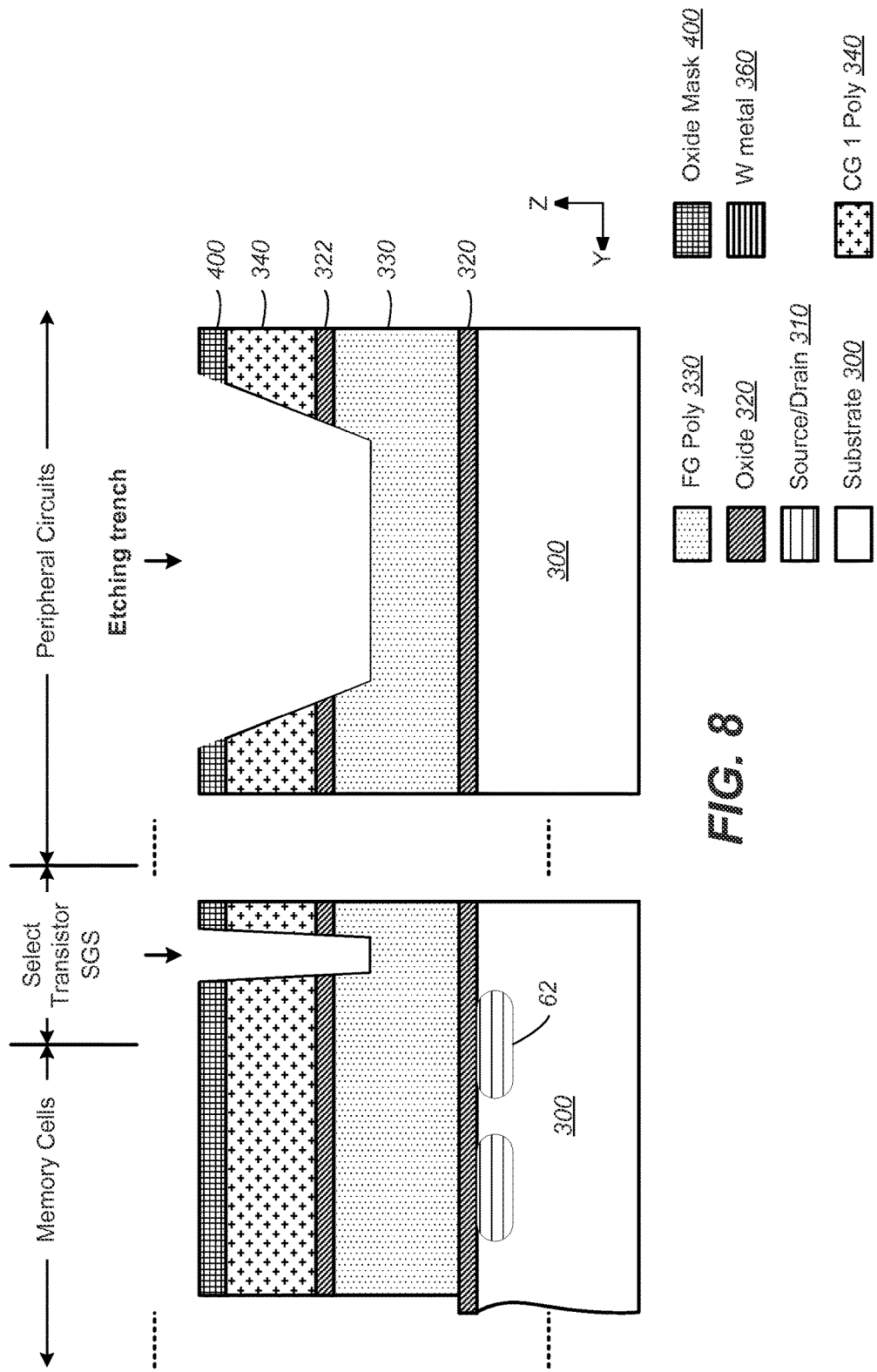
FIG. 8 is a cross-sectional view of the slab, illustrating the process of cutting trenches in the slab for poly plugs formation later.

FIG. 8 is a cross-sectional view of the slab, illustrating the process of cutting trenches in the slab for poly plugs formation later. This is accomplished by unmasking the oxide mask 400 where these poly plugs are to be formed, the sites of select transistor and slit contacts of the peripheral circuits. The trenches runs along the x-direction (not shown explicitly) and are spaced apart in the y-direction. Anisotropic etching cut the trenches to a depth reaching the FG poly 330.

Figure 9:
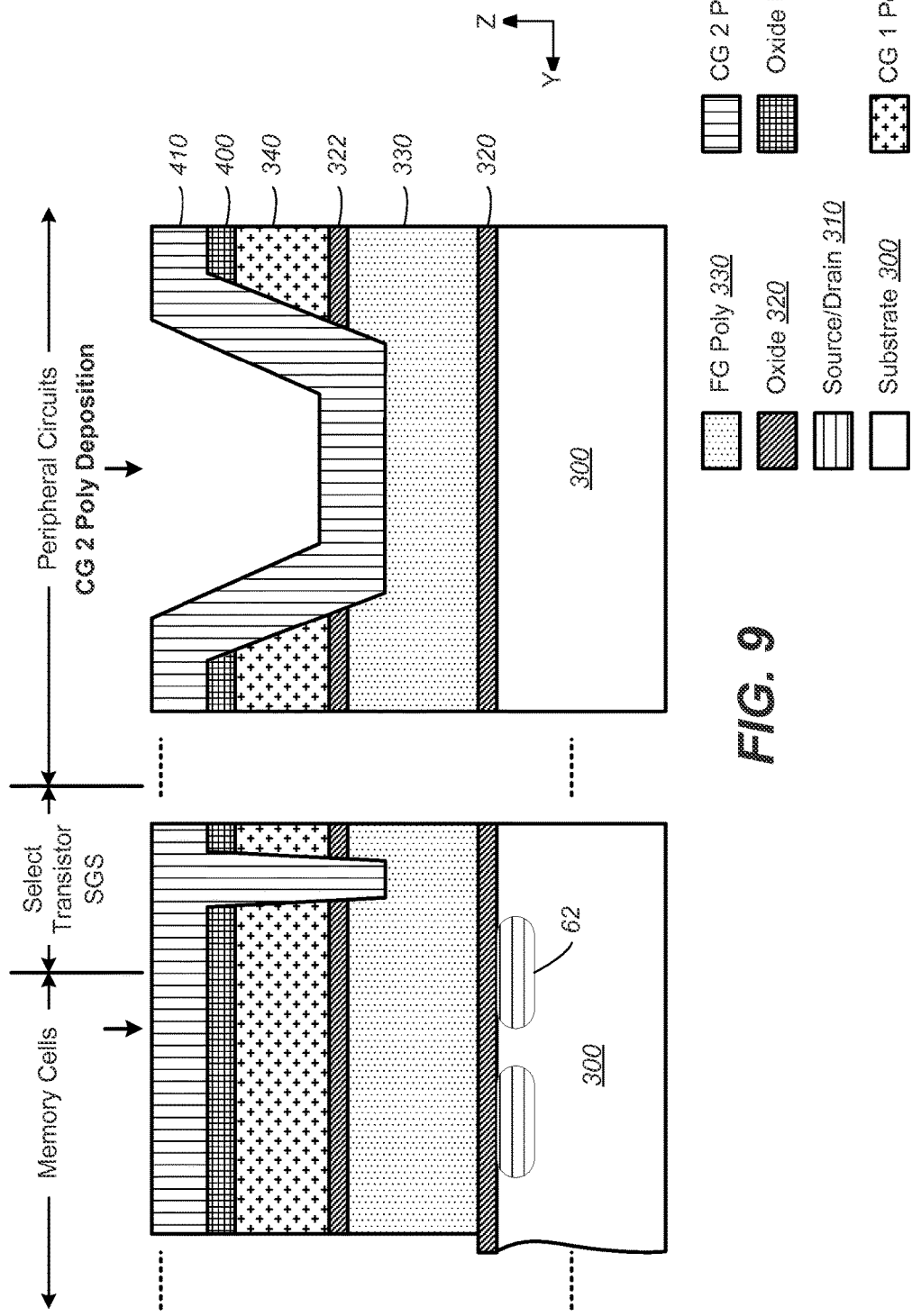
FIG. 9 is a cross-sectional view of the slab, illustrating the process of depositing a layer of CG 2 poly 410.

FIG. 9 is a cross-sectional view of the slab, illustrating the process of depositing a layer of CG 2 poly 410.

Figure 10:
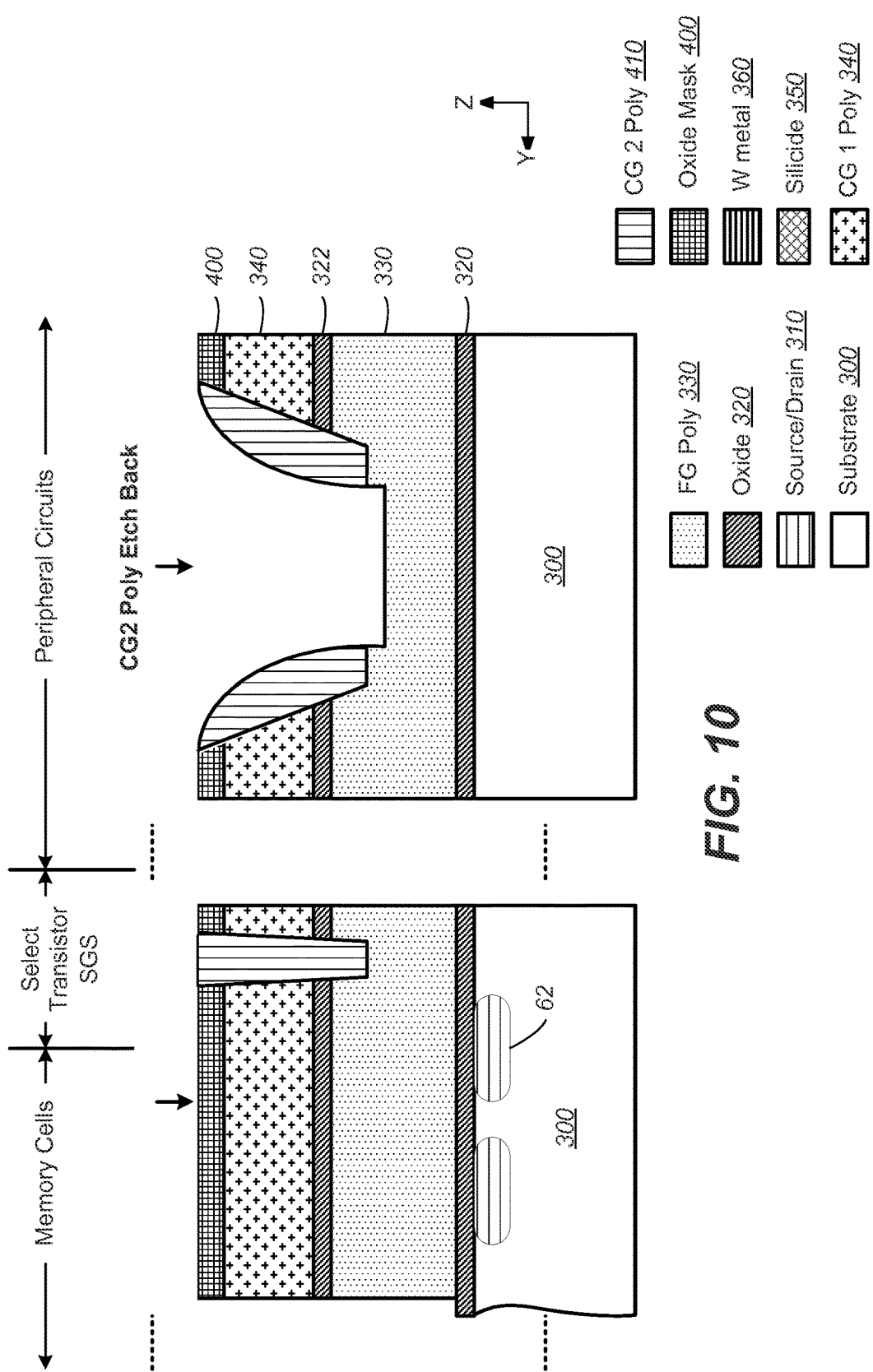
FIG. 10 is a cross-sectional view of the slab, illustrating the process of forming the poly plug in the select transistor region.

FIG. 10 is a cross-sectional view of the slab, illustrating the process of forming the poly plug in the select transistor region. This is accomplished by etching back the CG 2 poly 410. This basically leaves a poly plug in the select transistor region and a slit in the slit contact region of the peripheral circuits.

Figure 11:
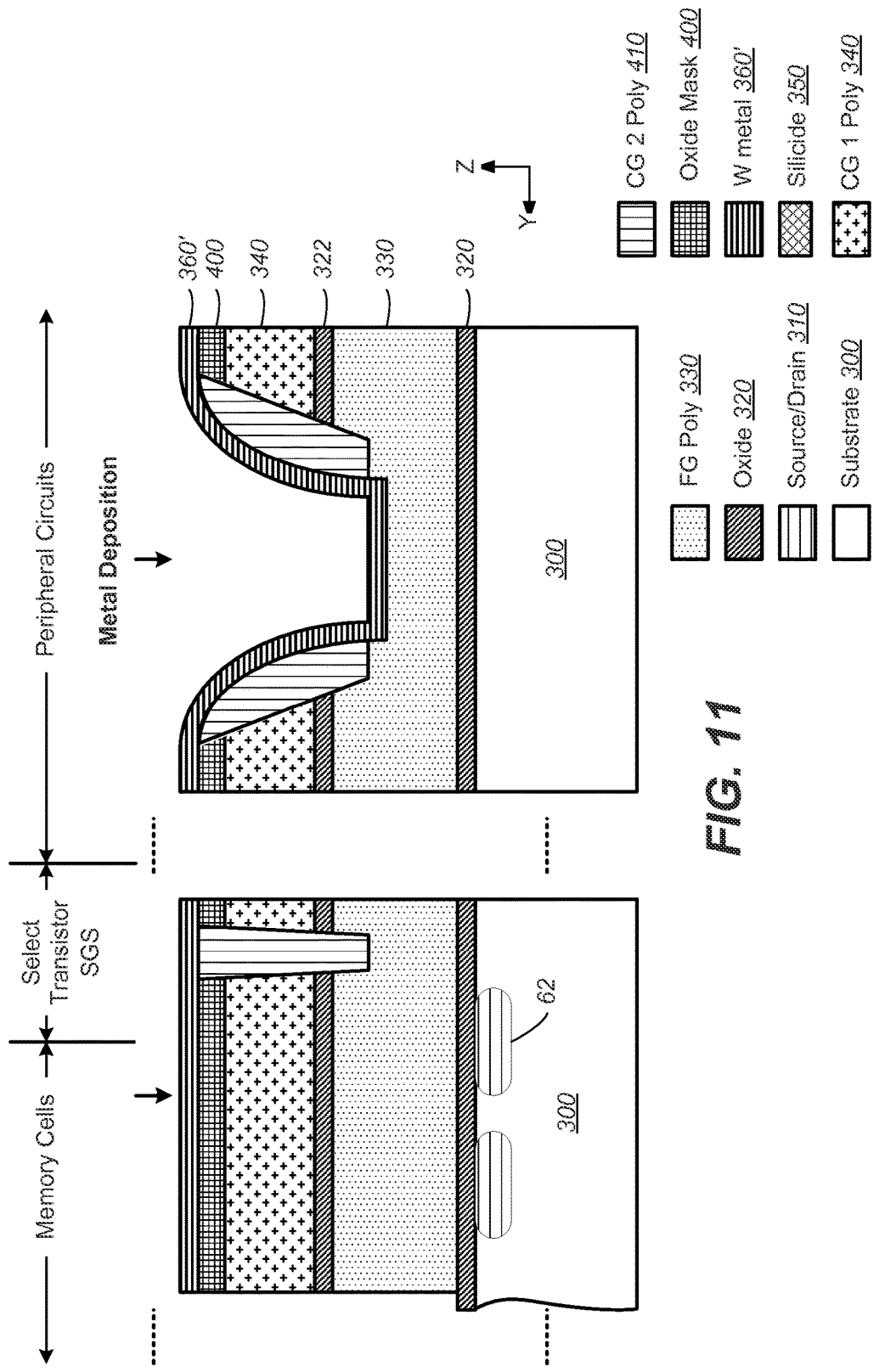
FIG. 11 is a cross-sectional view of the slab, illustrating the process of depositing a layer of metal on top of the poly plug and the slit.

FIG. 11 is a cross-sectional view of the slab, illustrating the process of depositing a first layer of metal 360' on top of the poly plug and the slit.

Figure 12:
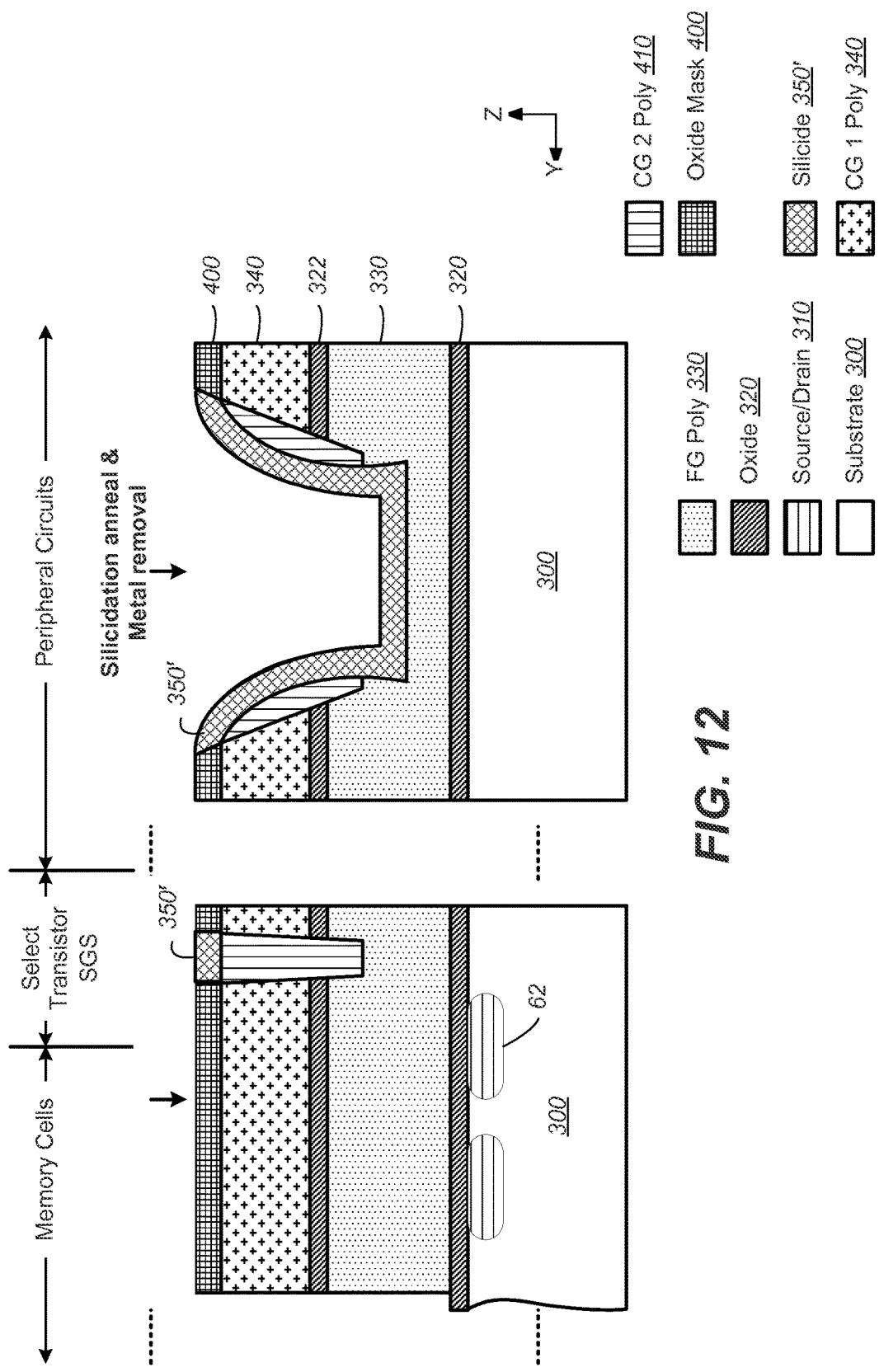
FIG. 12 is a cross-sectional view of the slab, illustrating the process of forming a first silicide layer and followed by removing of a metal layer.

FIG. 12 is a cross-sectional view of the slab, illustrating the process of forming a first silicide layer 350' and followed by removing the first metal layer 360'. In the select transistor region, the silicide layer 350' is formed at the interface between the first metal layer 360' and the poly plug filled with CG 2 Poly 410. In the peripheral circuits region, the silicide layer 350' is formed at the interface between the first metal layer 360' and the CG 2 Poly 410 and FG Poly 330. The silicide layer 350' is formed by annealing at elevated temperature so that the poly reacts with the metal to form the silicide. The silicide layer 350' has a thickness commensurate with the oxide mask 400.

Figure 13:
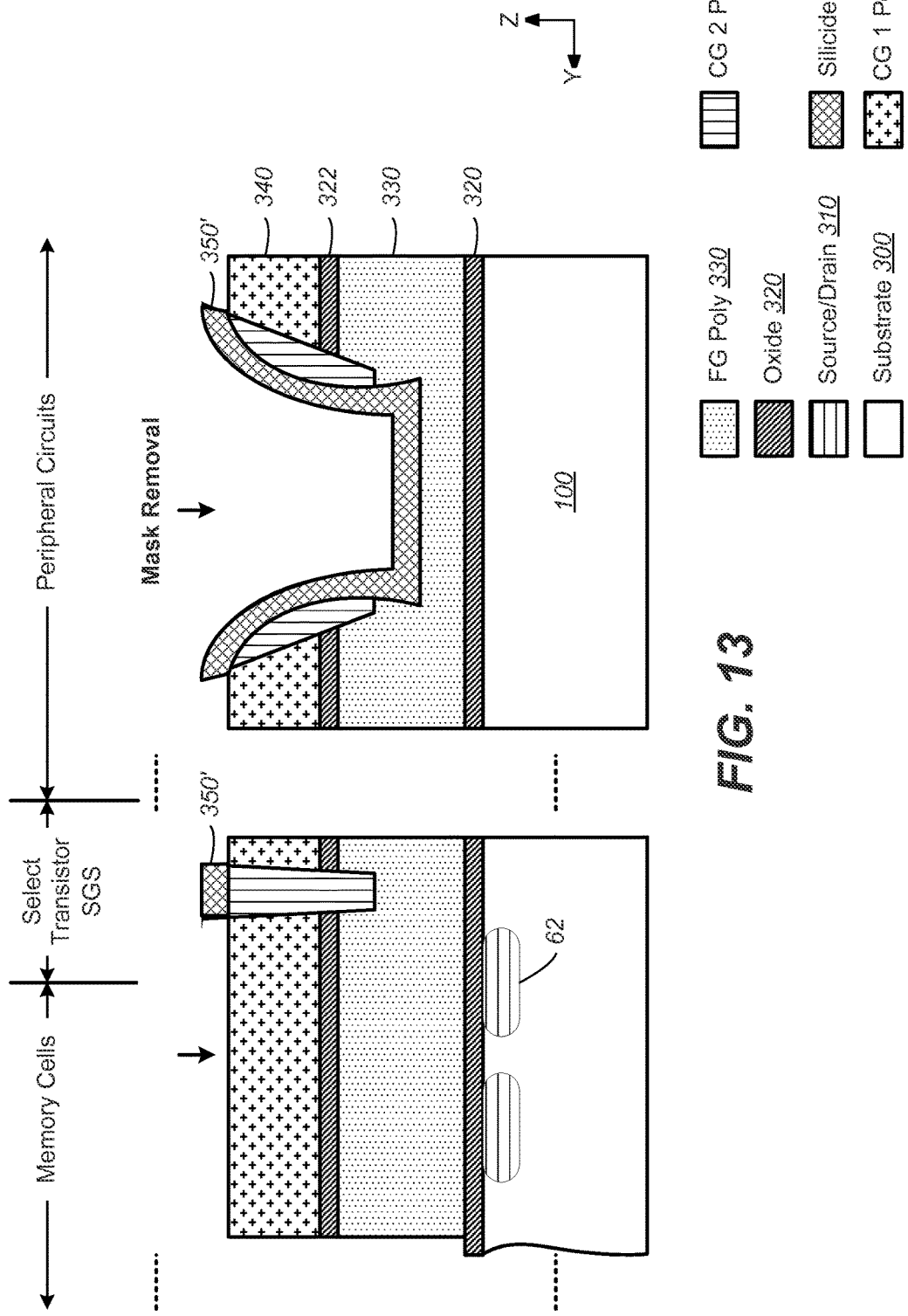
FIG. 13 is a cross-sectional view of the slab, illustrating the process of removing the mask 400.

FIG. 13 is a cross-sectional view of the slab, illustrating the process of removing the mask 400. This will expose the CG 1 poly layer 340.

Figure 14:
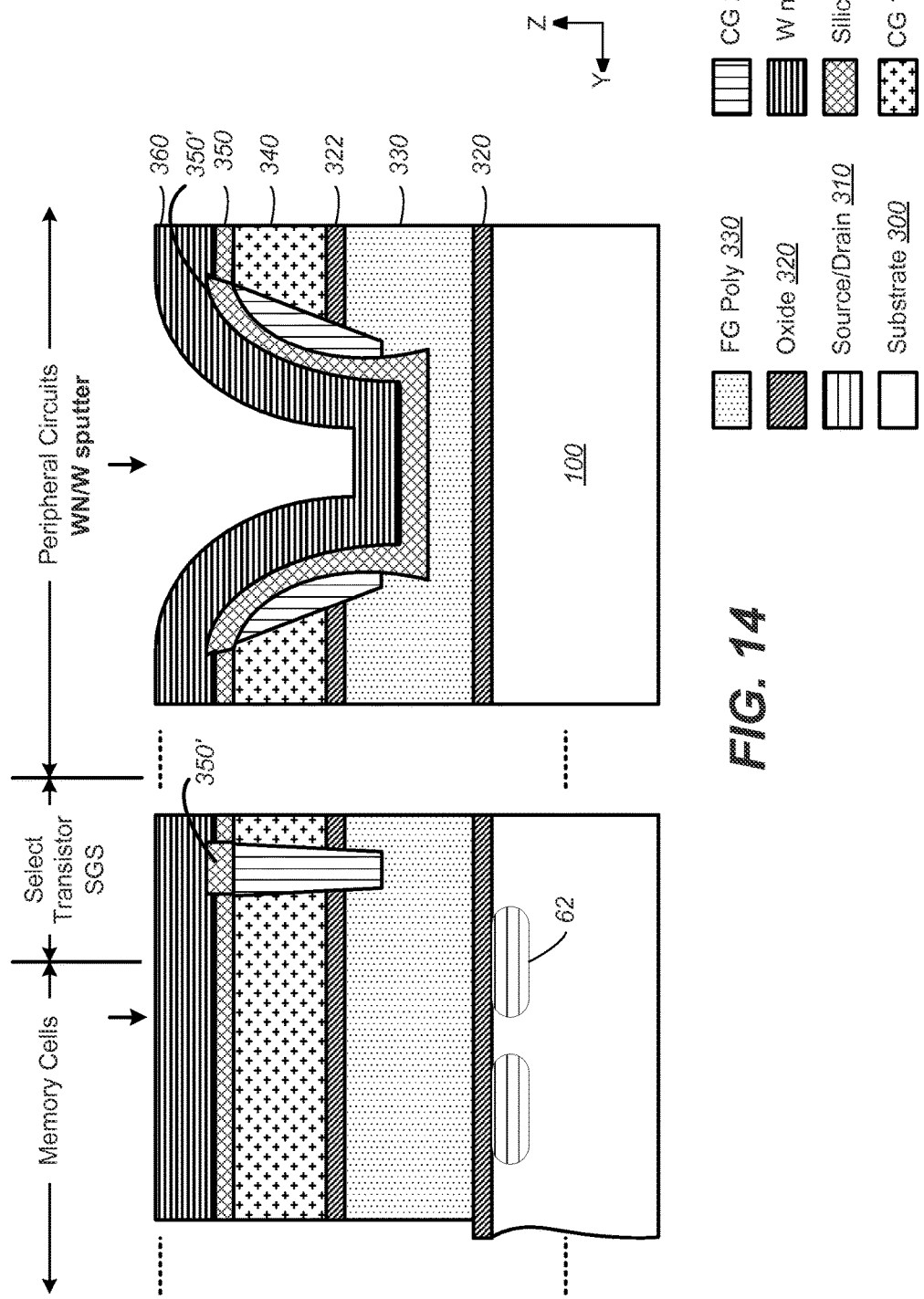
FIG. 14 is a cross-sectional view of the slab, illustrating the process of depositing a layer of metal by sputtering.

FIG. 14 is a cross-sectional view of the slab, illustrating the process of depositing a second metal layer by sputtering. This is followed by a process of forming a silicide layer between the second metal layer 360 and the CG 1 poly layer 340 by annealing.

Figure 15:
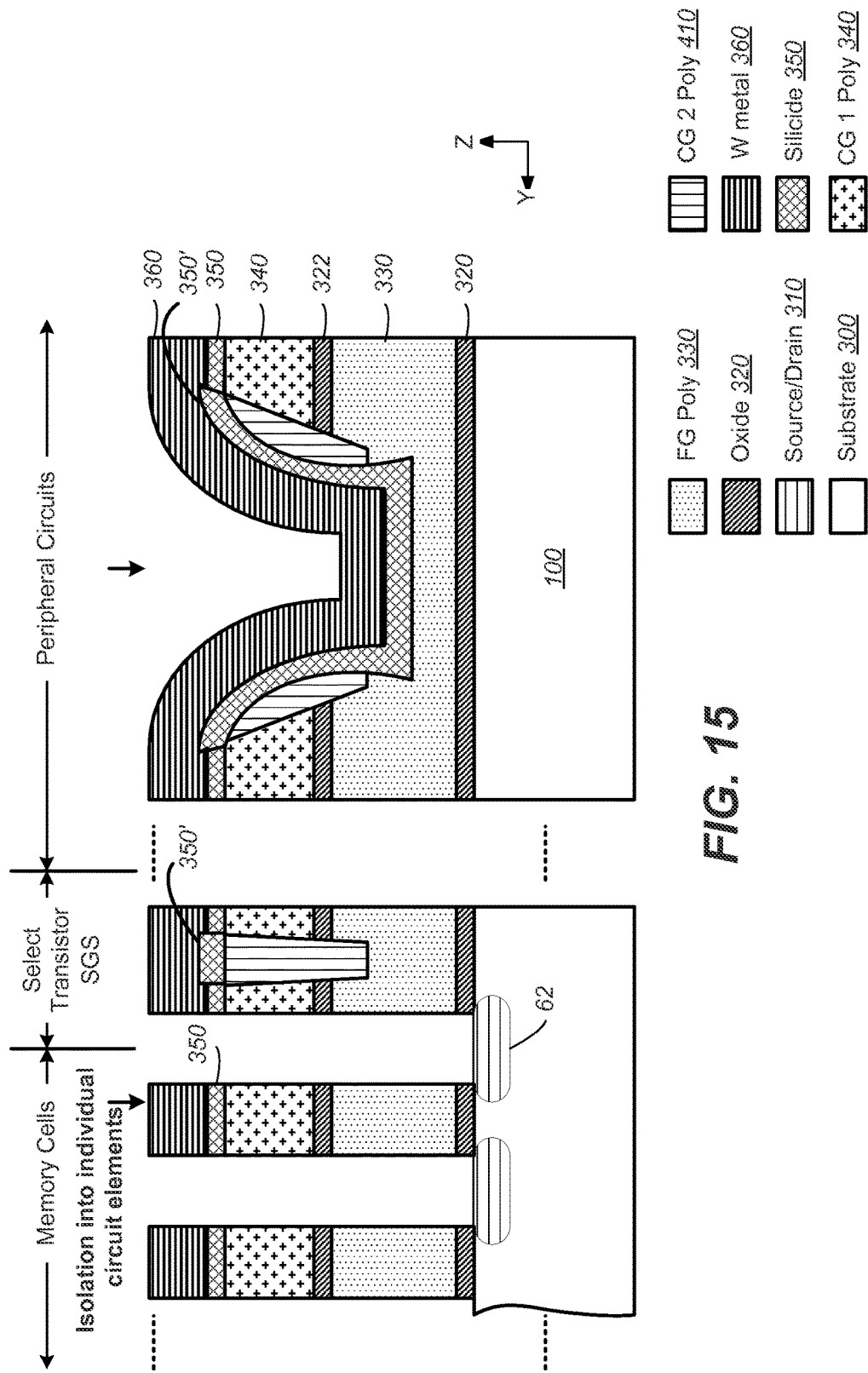
FIG. 15 is a cross-sectional view of the slab after, illustrating the process of segmenting the slab along the x-direction to provide isolation between memory cells and devices.

FIG. 15 is a cross-sectional view of the slab after, illustrating the process of segmenting the slab along the x-direction to provide isolation between memory cells and devices. Isolation trenches spaced apart in the y-direction are cut along the x-directions to form individual memory cells of each NAND string. Isolation trenches spaced apart in the x-direction and along the y-direction are cut to form individual NAND strings. These isolation trenches are eventually filled with isolation oxide (not shown).

It can be seen that the above-described process has silicide of a predetermined thickness 350 formed in the memory cell regions while a thicker silicide layer 350' is formed in the select device region and the peripheral circuit regions of the chip. In this way, the thickness of the silicide layers among the various regions of the chip can be independently optimized. In particular, the thickness of the silicide layer 350' for the slit contacts in the peripheral circuits can be increased independent of the silicide layer 350 of the memory cells. Similarly, the silicide layer 350' in the select transistor region is independent increased with respect to the silicide layer 350 of the memory cells. In this case, the conductivity of the thinner metal layer is not significantly reduced because of the larger metal line there compared with those at the memory cells.

The foregoing detailed description has been presented for purposes of illustration and description. It is not intended to be exhaustive or to limit the above to the precise form disclosed. Many modifications and variations are possible in light of the above teaching. The described embodiments were chosen in order to explain the principles involved and its practical application, to thereby enable others to best utilize the various embodiments and with various modifications as are suited to the particular use contemplated. It is intended that the scope be defined by the claims appended hereto.

It is claimed:

1. A method of forming a memory, comprising:
    forming a multi-layer slab on top of a semiconductor substrate with layers corresponding to structures of an array of NAND strings, and wherein the layers include a first region for forming memory cells of the NAND strings and a second region for forming select transistors and peripheral circuits components, and wherein a first polysilicon layer is deposited as a top layer of the multi-layer slab;
    masking the first polysilicon layer with a mask layer that leaves unmasked areas in designated areas among the second region;
    etching trenches in the unmasked areas;
    depositing a second polysilicon layer in the trenches;
    etching back the second polysilicon layer to the mask layer;
    depositing a first metal layer;
    annealing to form a first silicide layer between the first metal layer and the second polysilicon layer interfacing with the first metal layer;
    removing the first metal layer;
    removing the mask layer to expose the first polysilicon layer;
    depositing a second metal layer; and
    annealing to form a second silicide layer between the second metal layer and the first polysilicon layer.

2. The method as in claim 1, wherein:
    the peripheral circuits components include slit contacts;
    said etching back the second polysilicon layer to the mask layer also creates at each slit contact an exposed portion of a floating gate polysilicon below the first polysilicon layer; and
    said annealing to form a first silicide layer between the first metal layer and the second polysilicon layer interfacing with the first metal layer also has the first silicide layer formed between the first metal layer and the exposed floating gate polysilicon.

3. The method as in claim 1, wherein:
    the first and second metal layers are tungsten.

4. The method as in claim 1, wherein:
    the first polysilicon layer is for forming a portion of control gates of the memory cells.

5. The method as in claim 1, wherein:
    the first polysilicon layer is doped.

6. The method as in claim 1, wherein:
    the second polysilicon layer is for forming poly plugs that connect between the first polysilicon layer and a floating gate polysilicon layer.

7. A method of forming a memory having memory cells arranged in a three-dimensional pattern defined by rectangular coordinates having x, y and z-directions, said method comprising:
    forming a multi-layer slab on top of a semiconductor substrate in an x-y plane, the layers of the multi-layer slab being stacked in the z-direction and corresponding to structures of an array in the x-y plane of NAND strings, and wherein the layers include a first region for forming memory cells of the NAND strings and a second region for forming select transistors and peripheral circuits components, and wherein a first polysilicon layer is deposited as a top layer of the multi-layer slab;
    masking the first polysilicon layer with a mask layer that leaves unmasked areas in designated areas among the second region;
    etching trenches in the unmasked areas;
    depositing a second polysilicon layer in the trenches;
    etching back the second polysilicon layer to the mask layer;
    depositing a first metal layer;
    annealing to form a first silicide layer between the first metal layer and the second polysilicon layer interfacing with the first metal layer;
    removing the first metal layer;
    removing the mask layer to expose the first polysilicon layer;
    depositing a second metal layer; and
    annealing to form a second silicide layer between the second metal layer and the first polysilicon layer.

8. The method as in claim 7, wherein:
    the peripheral circuits components include slit contacts;
    said etching back the second polysilicon layer to the mask layer also creates at each slit contact an exposed portion of a floating gate polysilicon below the first polysilicon layer; and
    said annealing to form a first silicide layer between the first metal layer and the second polysilicon layer interfacing with the first metal layer also has the first silicide layer formed between the first metal layer and the exposed floating gate polysilicon.

9. The method as in claim 7, wherein:
the first and second metal layers are tungsten.

10. The method as in claim 7, wherein:
the first polysilicon layer is for forming a portion of control gates of the memory cells.

11. The method as in claim 7, wherein:
the second polysilicon layer is for forming poly plugs that connect between the first polysilicon layer and a floating gate polysilicon layer.

\* \* \* \* \*